(12) United States Patent
Kim et al.

(10) Patent No.: US 8,906,757 B2
(45) Date of Patent: Dec. 9, 2014

(54) METHODS OF FORMING PATTERNS OF A SEMICONDUCTOR DEVICE

(71) Applicant: Samsung Electronics Co., Ltd., Suwon-si (KR)

(72) Inventors: Myeong-Cheol Kim, Suwon-si (KR); Il-Sup Kim, Suwon-si (KR); Cheol Kim, Hwaseong-si (KR); Jong-Chan Shin, Seongnam-si (KR); Jong-Wook Lee, Yongin-si (KR); Choong-Ho Lee, Yongin-si (KR); Si-Young Choi, Seongnam-si (KR); Jong-Seo Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 13/674,386

(22) Filed: Nov. 12, 2012

(65) Prior Publication Data

US 2013/0143372 A1    Jun. 6, 2013

(30) Foreign Application Priority Data

Dec. 6, 2011  (KR) .................. 10-2011-0129820

(51) Int. Cl.
| | |
|---|---|
| *H01L 21/00* | (2006.01) |
| *H01L 21/84* | (2006.01) |
| *H01L 21/308* | (2006.01) |
| *H01L 21/033* | (2006.01) |

(52) U.S. Cl.
CPC ........ *H01L 21/3081* (2013.01); *H01L 21/3086* (2013.01); *H01L 21/0337* (2013.01)
USPC .......... 438/163; 438/618; 438/694; 438/787; 257/E21.035; 257/E21.235

(58) Field of Classification Search
USPC ......... 438/163–299, 618, 694–696, 700, 736, 438/787; 257/506, 734, E21.27, E21.026, 257/E21.035, E21.038, E21.039
See application file for complete search history.

(56) References Cited

U.S. PATENT DOCUMENTS 7,265,059 B2    9/2007   Rao et al.
7,390,750 B1 *  6/2008   Ramkumar et al. .......... 438/706

(Continued)

FOREIGN PATENT DOCUMENTS

| | | |
|---|---|---|
| JP | 2008-277550 | 11/2008 |
| JP | 2009-010156 | 1/2009 |
| JP | 2010-245173 | 10/2010 |
| KR | 1020110076661 | 7/2011 |

*Primary Examiner* — Charles Garber
*Assistant Examiner* — Abdulfattah Mustapha
(74) *Attorney, Agent, or Firm* — Myers Bigel Sibley & Sajovec, PA

(57) ABSTRACT

Methods of forming patterns of a semiconductor device are provided. The methods may include forming a hard mask film on a semiconductor substrate. The methods may include forming first and second sacrificial film patterns that are spaced apart from each other on the hard mask film. The methods may include forming a first spacer on opposing sidewalls of the first sacrificial film pattern and a second spacer on opposing sidewalls of the second sacrificial film pattern. The methods may include removing the first and second sacrificial film patterns. The methods may include trimming the second spacer such that a line width of the second spacer becomes smaller than a line width of the first spacer. The methods may include forming first and second hard mask film patterns by etching the hard mask film using the first spacer and the trimmed second spacer as an etch mask.

20 Claims, 12 Drawing Sheets

(56) References Cited

U.S. PATENT DOCUMENTS

| | | |
|---|---|---|
| 7,737,039 B2 | 6/2010 | Sandhu et al. |
| 7,745,339 B2 | 6/2010 | Jung |
| 7,960,265 B2 | 6/2011 | Jung |
| 2005/0153562 A1* | 7/2005 | Furukawa et al. ............ 438/694 |
| 2006/0024945 A1* | 2/2006 | Kim et al. ..................... 438/618 |
| 2006/0281266 A1* | 12/2006 | Wells ............................ 438/299 |
| 2007/0114612 A1* | 5/2007 | Ahn et al. ..................... 257/364 |
| 2008/0124931 A1 | 5/2008 | Lee et al. |
| 2008/0188083 A1 | 8/2008 | Jeon et al. |
| 2009/0093121 A1 | 4/2009 | Moon |
| 2009/0209109 A1 | 8/2009 | Yaegashi et al. |
| 2009/0239382 A1* | 9/2009 | Zhu .............................. 438/696 |
| 2009/0263749 A1 | 10/2009 | Sim et al. |
| 2010/0173492 A1 | 7/2010 | Kim et al. |
| 2010/0183958 A1 | 7/2010 | Inaba |

\* cited by examiner

METHODS OF FORMING PATTERNS OF A SEMICONDUCTOR DEVICE

This U.S. non-provisional patent application claims priority under 35 U.S.C. §119 to Korean Patent Application No. 10-2011-0129820, filed on Dec. 6, 2011, in the Korean Intellectual Property Office, the disclosure of which is hereby incorporated herein by reference in its entirety.

BACKGROUND

The present disclosure relates to methods of forming patterns of a semiconductor device.

As semiconductor devices have decreased in size, fin-type field effect transistors (FinFETs) have been introduced to secure characteristics of logic devices. A technology for forming fine patterns may be used to form fins of a FinFET. For example, a double-patterning technology (DPT) using spacers can be utilized to form fine patterns used as fins of a FinFET.

A threshold voltage Vth of a FinFET may be related to line widths of fins of the FinFET. When a DPT using spacers is utilized, however, patterns having the same line width may be formed because spacers typically have the same line width. Thus, it may be difficult to form patterns having varying line widths.

SUMMARY

According to various embodiments of the present inventive concepts, methods of forming patterns of a semiconductor device are provided. The methods may include forming a hard mask film on a semiconductor substrate. The methods may include forming first and second sacrificial film patterns that are spaced apart from each other on the hard mask film. The methods may include forming a first spacer on opposing sidewalls of the first sacrificial film pattern and a second spacer on opposing sidewalls of the second sacrificial film pattern. The methods may include removing the first and second sacrificial film patterns. The methods may include trimming the second spacer such that a line width of the second spacer becomes smaller than a line width of the first spacer. The methods may include forming first and second hard mask film patterns by etching the hard mask film using the first spacer and the trimmed second spacer as an etch mask.

In various embodiments, the hard mask film may include a nitride film and/or an oxide film, the first and second sacrificial film patterns may include carbon film patterns, and the first and second spacers may include oxide film spacers.

According to various embodiments, the methods may include forming first and second semiconductor patterns having different line widths by etching the semiconductor substrate using the first and second hard mask film patterns as an etch mask. The semiconductor device may include a fin-type field effect transistor (FinFET). A portion of the first semiconductor pattern and a portion of the second semiconductor pattern may include a first channel region and a second channel region, respectively.

In various embodiments, a line width of the first channel region may be greater than a line width of the second channel region.

According to various embodiments, a pitch of/between neighboring portions of the first semiconductor pattern may be substantially equal to a pitch of/between neighboring portions of the second semiconductor pattern.

In various embodiments, forming the first and second sacrificial film patterns may include forming a sacrificial film including a carbon film on the hard mask film, forming first and second oxynitride film patterns that are spaced apart from each other on the sacrificial film, and etching the sacrificial film using the first and second oxynitride film patterns as an etch mask.

According to various embodiments, the methods may include forming a buffer film on the hard mask film after forming the hard mask film and before forming the first and second sacrificial film patterns. The methods may include forming first and second buffer film patterns by etching the buffer film using the first and second spacers as an etch mask after removing the first and second sacrificial film patterns and before trimming the second spacer. Forming the first and second sacrificial film patterns may include forming the first and second sacrificial film patterns on the buffer film. Trimming the second spacer may include trimming the second spacer and the second buffer film pattern. Forming the first and second hard mask film patterns may include forming the first hard mask film pattern by etching the hard mask film using the first spacer and the first buffer film pattern as an etch mask and forming the second hard mask film pattern by etching the hard mask film using the trimmed second spacer and the trimmed second buffer film pattern as an etch mask.

In various embodiments, trimming the second spacer and the second buffer film may include forming a blocking mask on the first spacer and the first buffer film pattern, etching the second spacer such that the line width of the second spacer becomes smaller than the line width of the first spacer, and etching the second buffer film pattern such that a line width of the second buffer film pattern becomes smaller than a line width of the first buffer film pattern.

According to various embodiments, the hard mask film may include a nitride film or an oxide film. The first and second sacrificial film patterns may include carbon film patterns. The first and second spacers may include oxide film spacers. The buffer film may include a polysilicon film. Trimming the second spacer and the second buffer film pattern may include etching the second spacer and the second buffer film pattern using wet etching or plasma etching.

In various embodiments, the opposing sidewalls of the first and second sacrificial film patterns may include first and second sidewalls and third and fourth sidewalls, respectively. The first spacer may include a first portion formed on the first sidewall of the first sacrificial film pattern and a second portion formed on the second sidewall of the first sacrificial film pattern. The second spacer may include a third portion formed on the third sidewall of the second sacrificial film pattern and a fourth portion formed on the fourth sidewall of the second sacrificial film pattern. Trimming the second spacer may include trimming the third and fourth portions such that respective line widths of the third and fourth portions become smaller than a line width of the first portion or the second portion, and such that a pitch of/between the first portion and the second portion is substantially equal to a pitch of/between the trimmed third portion and the trimmed fourth portion.

Methods of forming patterns of a semiconductor device according to various embodiments may include forming a nitride film and a polysilicon film sequentially on a semiconductor substrate. The methods may include forming first and second carbon film patterns that are spaced apart from each other on the polysilicon film. The methods may include forming a first oxide film spacer on opposing sidewalls of the first carbon film pattern and a second oxide film spacer on opposing sidewalls of the second carbon film pattern. The methods may include removing the first and second carbon film patterns. The methods may include forming first and second polysilicon film patterns by etching the polysilicon film using the first and second oxide film spacers as an etch mask. The methods may include trimming the second oxide film spacer and the second polysilicon film pattern such that a line width of the second oxide film spacer becomes smaller than a line width of the first oxide film spacer and that a line width of the second polysilicon film pattern becomes smaller than a line width of the first polysilicon film pattern. The methods may include forming first and second nitride film patterns by etching the nitride film using the first polysilicon film pattern and the trimmed second polysilicon film pattern as an etch mask.

In various embodiments, trimming the second oxide film spacer and the second polysilicon film pattern may include forming amorphous carbon or photoresist on the first oxide film spacer and the first polysilicon film pattern and wet-etching the second oxide film spacer and the second polysilicon film pattern using hydrogen fluoride (HF) as a base.

According to various embodiments, the methods may include forming first and second semiconductor patterns having different line widths by etching the semiconductor substrate using the first and second nitride film patterns as an etch mask. The semiconductor device may include a FinFET. A portion of the first semiconductor pattern and a portion of the second semiconductor pattern may include a first channel region and a second channel region, respectively.

In various embodiments, a pitch of/between neighboring portions of the first semiconductor pattern may be substantially equal to a pitch of/between neighboring portions of the second semiconductor pattern.

According to various embodiments, forming the first and second carbon film patterns may include forming a carbon film on the nitride film, forming first and second oxynitride film patterns that are spaced apart from each other on the carbon film, and etching the carbon film using the first and second oxynitride film patterns as an etch mask.

Methods of forming patterns of a fin-type field effect transistor (FinFET) semiconductor device according to various embodiments may include forming a hard mask film on a semiconductor substrate. The methods may include forming first and second sacrificial film patterns that are spaced apart from each other on the hard mask film. The methods may include forming a first spacer on opposing sidewalls of the first sacrificial film pattern and a second spacer on opposing sidewalls of the second sacrificial film pattern. The methods may include removing the first and second sacrificial film patterns. The methods may include trimming the second spacer such that a line width of the second spacer becomes smaller than a line width of the first spacer. The methods may include forming first and second hard mask film patterns by etching the hard mask film using the first spacer and the trimmed second spacer as an etch mask. The methods may include forming first and second semiconductor patterns having different line widths by etching the semiconductor substrate using the first and second hard mask film patterns as an etch mask.

In various embodiments, a portion of the first semiconductor pattern and a portion of the second semiconductor pattern may include a first channel region and a second channel region, respectively. A line width of the first channel region may be greater than a line width of the second channel region. A pitch of/between neighboring portions of the first semiconductor pattern may be substantially equal to a pitch of/between neighboring portions of the second semiconductor pattern.

According to various embodiments, the methods may include forming a buffer film on the hard mask film before forming the first and second sacrificial film patterns. The methods may include forming first and second buffer film patterns by etching the buffer film using the first and second spacers as an etch mask after removing the first and second sacrificial film patterns and before trimming the second spacer. Trimming the second spacer may include trimming the second spacer and the second buffer film pattern. Forming the first and second hard mask film patterns may include forming the first hard mask film pattern by etching the hard mask film using the first spacer and the first buffer film pattern as an etch mask and forming the second hard mask film pattern by etching the hard mask film using the trimmed second spacer and the trimmed second buffer film pattern as an etch mask, such that the first spacer and the trimmed second spacer are removed and portions of the first buffer film pattern and the trimmed second buffer film pattern are etched.

In various embodiments, trimming the second spacer and the second buffer film may include forming a blocking mask on sidewalls of the first spacer and sidewalls of the first buffer film pattern, etching the second spacer such that the line width of the second spacer becomes smaller than the line width of the first spacer, and etching the second buffer film pattern such that a line width of the second buffer film pattern becomes smaller than a line width of the first buffer film pattern.

According to various embodiments, the methods may include forming a buffer film on the hard mask film after forming the hard mask film and before forming the first and second sacrificial film patterns. The methods may include forming first and second buffer film patterns by etching the buffer film using the first and second spacers as an etch mask after removing the first and second sacrificial film patterns and after trimming the second spacer.

BRIEF DESCRIPTION OF THE DRAWINGS

The above and other features and advantages of the disclosure will become more apparent in view of the attached drawings and accompanying detailed description.

DETAILED DESCRIPTION

Figure 1:
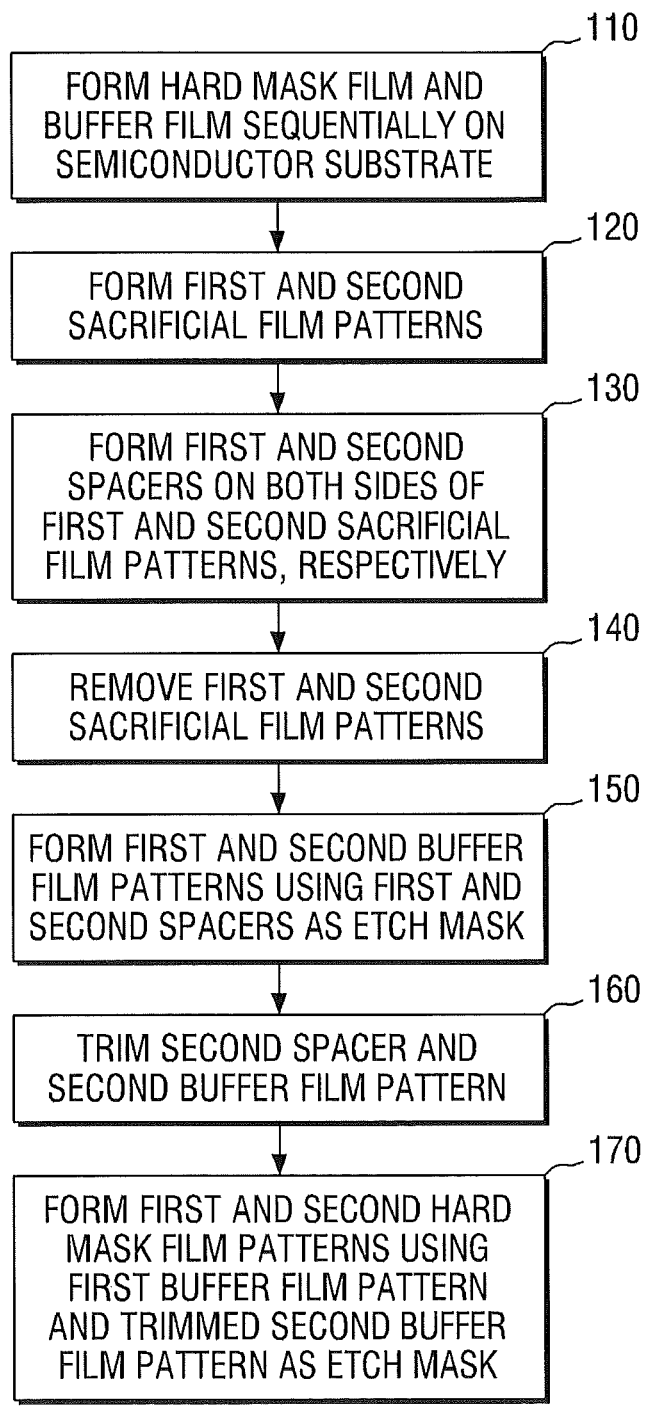
FIG. 1 is a flowchart illustrating operations of forming patterns of a semiconductor device according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Operations (e.g., methods, processes, etc.) of forming patterns of a semiconductor device according to various embodiments of the present inventive concepts will now be described with reference to FIGS. 1 through 12. FIG. 1 is a flowchart illustrating operations of forming patterns of a semiconductor device according to various embodiments of the present inventive concepts. FIGS. 2 through 12 are cross-sectional views illustrating the operations of forming patterns of a semiconductor device of FIG. 1 according to various embodiments of the present inventive concepts.

Figure 2:
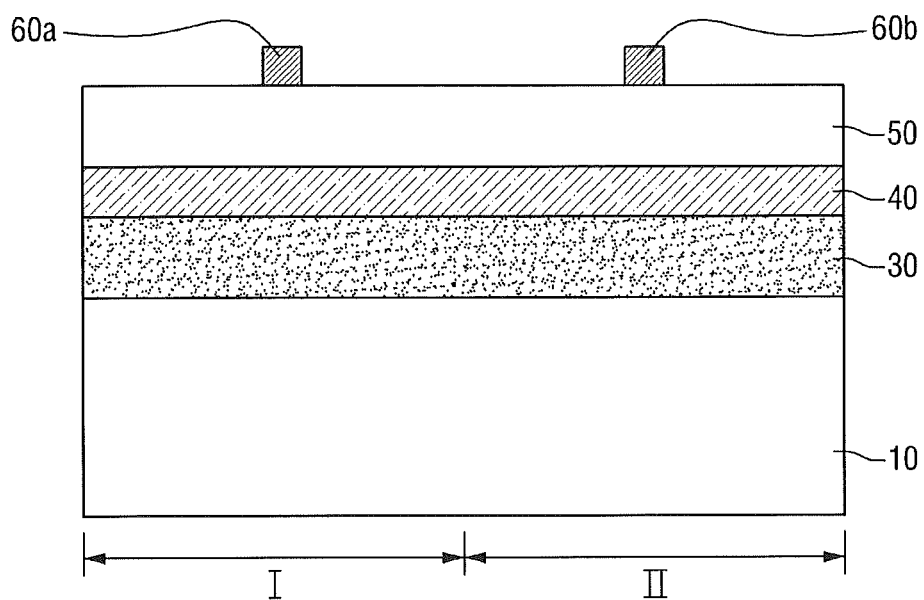
FIGS. 2 through 12 are cross-sectional views illustrating the operations of forming patterns of a semiconductor device of FIG. 1 according to various embodiments of the present inventive concepts.

Referring to FIGS. 1 and 2, a hard mask film 30 and a buffer film 40 may be formed sequentially on a semiconductor substrate 10 (Block 110).

Specifically, the hard mask film 30, the buffer film 40, and a sacrificial film 50 may be formed sequentially on the semiconductor substrate 10. First and second etched mask film patterns 60a and 60b may be formed on the sacrificial film 50 to be separated (e.g., spaced apart) from each other.

Figure 12:
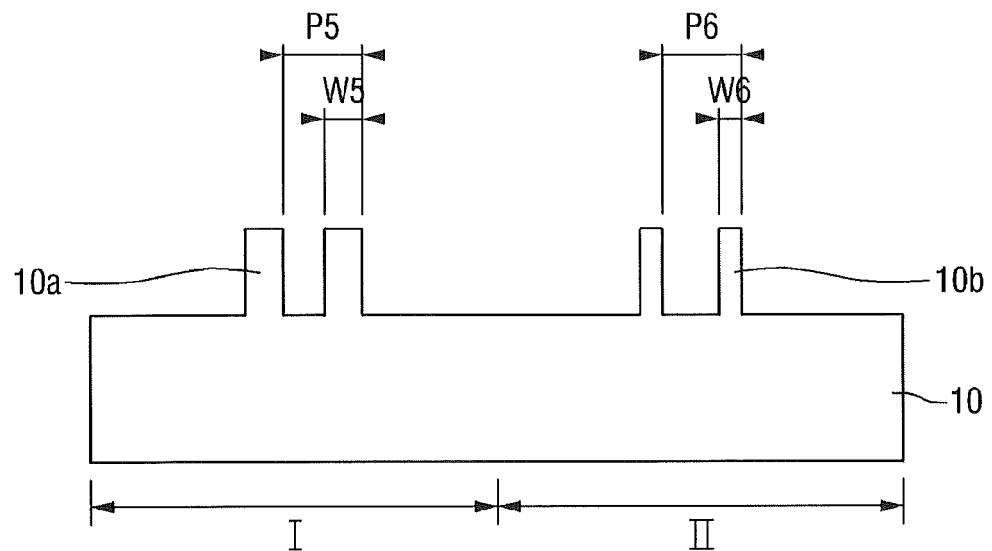

The semiconductor substrate 10 may be, but is not limited to, a silicon substrate. The semiconductor substrate 10 may include a first region I and a second region II. The first region I may be defined as a region where a first semiconductor pattern 10a (e.g., as illustrated in FIG. 12) is to be formed, and the second region II may be defined as a region where a second semiconductor pattern 10b (e.g., as illustrated in FIG. 12) is to be formed.

The hard mask film 30 may be any one of, but is not limited to, a nitride (e.g., $Si_3N_4$) film and an oxide (e.g., $SiO_2$) film. The hard mask film 30 may be patterned to form an etch mask for etching the semiconductor substrate 10.

The buffer film 40 may be any one of, but is not limited to, a polysilicon film and a metal film. The buffer film 40 may be patterned to form an etch mask for etching the hard mask film 30.

The sacrificial film 50 may be used as a sacrificial layer for applying double-patterning technology in the operations of forming patterns of a semiconductor device according to various embodiments of the present inventive concepts. The sacrificial film 50 may be any one of, but is not limited to, an amorphous carbon film and a metal film. To form the sacrificial film 50 as an amorphous carbon film, a spin coating process and a bake process may be used. Specifically, an organic compound layer may be formed on the buffer film 40 using a spin coating process and then cured using a bake process, thereby forming the sacrificial film 50.

The first and second etched mask film patterns 60a and 60b may be, but are not limited to, oxynitride film (e.g., SiON) patterns. The first and second etched mask film patterns 60a and 60b may be used as an etch mask in a process of patterning the sacrificial film 50. Therefore, the first and second etched mask film patterns 60a and 60b may be made of a material having a different etch selectivity from the sacrificial film 50.

The first and second etched mask film patterns 60a and 60b may be formed to be separated (e.g., spaced apart) from each other. Specifically, the first etched mask film pattern 60*a* may be formed on the first region I of the semiconductor substrate 10, and the second etched mask film pattern 60*b* may be formed on the second region II of the semiconductor substrate 10.

Figure 3:
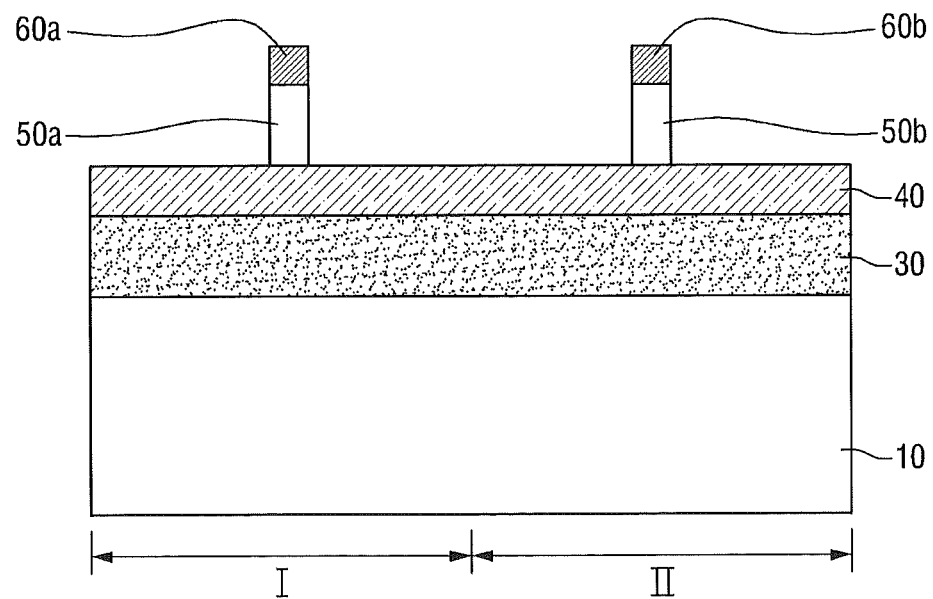

Referring to FIGS. 1 and 3, first and second sacrificial film patterns 50*a* and 50*b* may be formed on the buffer film 40 to be separated (e.g., spaced apart) from each other (Block 120).

Specifically, the sacrificial film 50 (e.g., as illustrated in FIG. 2) may be etched using the first and second etched mask film patterns 60*a* and 60*b* as an etch mask. The etching of the sacrificial film 50 may result in the formation of the first sacrificial film pattern 50*a* on the first region I of the semiconductor substrate 10 and the formation of the second sacrificial film pattern 50*b* on the second region II of the semiconductor substrate 10.

The first and second sacrificial film patterns 50*a* and 50*b* may be formed simultaneously on the buffer film 40. The first and second etched mask film patterns 60*a* and 60*b* may be used as an etch mask and may remain on the first and second sacrificial film patterns 50*a* and 50*b*, respectively. For example, the first sacrificial film pattern 50*a* and the first etched mask film pattern 60*a* may be formed on the first region I of the semiconductor substrate 10, and the second sacrificial film pattern 50*b* and the second etched mask film pattern 60*b* may be formed on the second region II of the semiconductor substrate 10.

Figure 4:
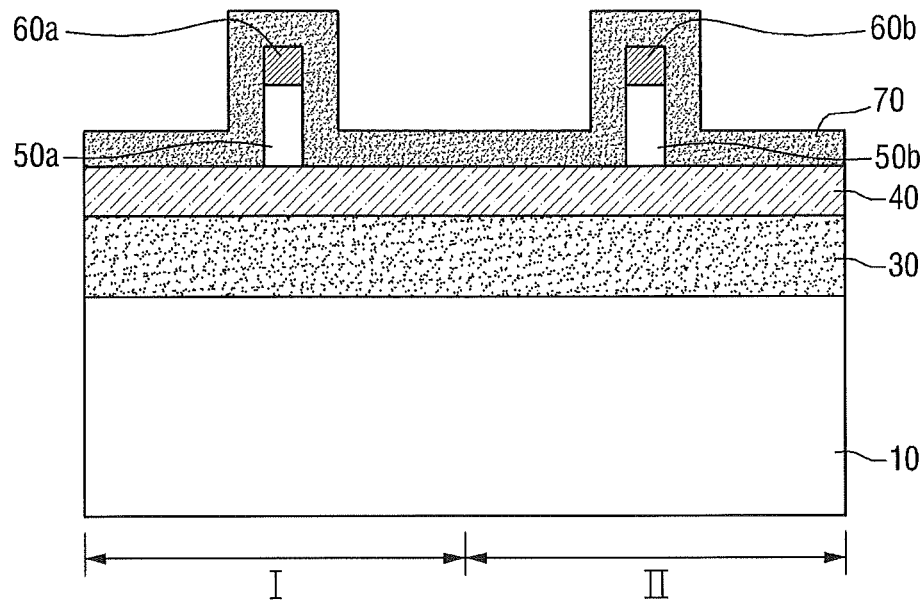
Figure 5:
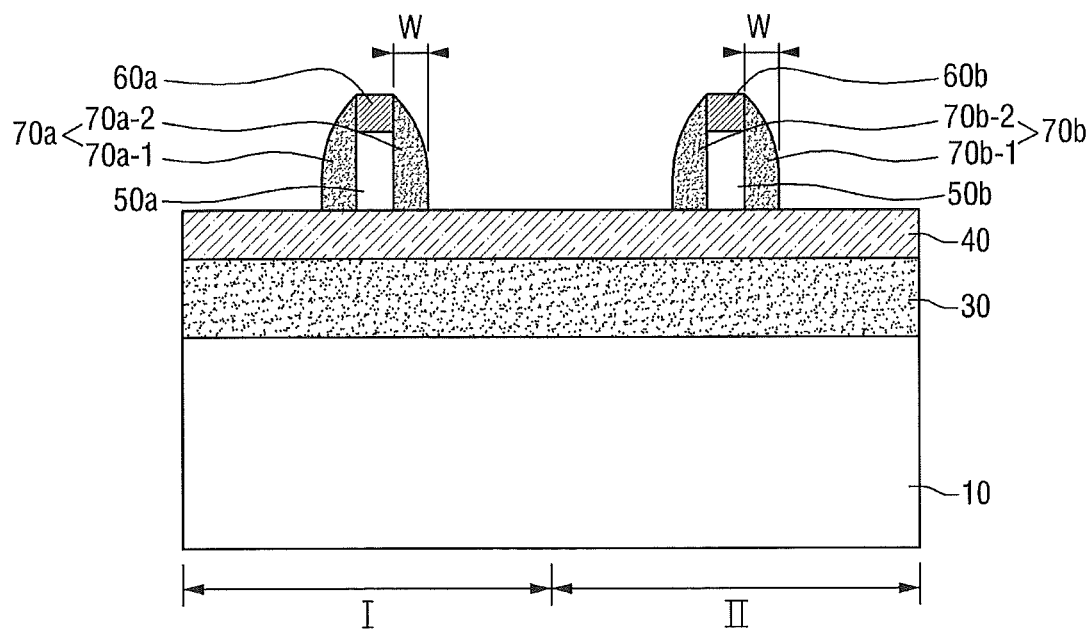

Referring to FIGS. 1, 4, and 5, a first spacer 70*a* may be formed on both sides (e.g., on opposing sidewalls) of the first sacrificial film pattern 50*a*, and a second spacer 70*b* may be formed on both sides (e.g., on opposing sidewalls) of the second sacrificial film pattern 50*b* (Block 130). It will be understood that the phrase "opposing sidewalls" as used herein refers to sidewalls that are on opposite (e.g., right and left) sides of a pattern.

For example, referring to FIG. 4, a spacer film 70 may be conformally formed on the semiconductor substrate 10. Specifically, the spacer film 70 may be conformally formed on a top surface of the buffer film 40, both/opposing side surfaces of each of the first and second sacrificial film patterns 50*a* and 50*b*, and both/opposing side surfaces and a top surface of each of the first and second etched mask film patterns 60*a* and 60*b*.

The spacer film 70 may be, but is not limited to, an oxide (e.g., $SiO_2$) film. The spacer film 70 may be formed by, for example, an atomic layer deposition (ALD) process at room temperature.

Referring to FIG. 5, the spacer film 70 (e.g., as illustrated in FIG. 4) may be etched back, thereby forming the first spacer 70*a* on both/opposing sides of the first sacrificial film pattern 50*a* and the second spacer 70*b* on both/opposing sides of the second sacrificial film pattern 50*b*. The first and second spacers 70*a* and 70*b* may be oxide film spacers. The first spacer 70*a* may be formed on the first region I of the semiconductor substrate 10, and the second spacer 70*b* may be formed on the second region II of the semiconductor substrate 10.

Because an oxide film and a polysilicon film have different etch selectivities, it may be relatively easy to form the first and second spacers 70*a* and 70*b* by etching back the spacer film 70 (i.e., an oxide film) disposed on the buffer film 40 (i.e., a polysilicon film).

A line width W of the first spacer 70*a* may be equal to a line width W of the second spacer 70*b*. In the present specification, a line width of a pattern may be defined as a maximum (e.g., widest) line width of the pattern. For example, a line width may refer to an entire width of a protruding portion of the pattern.

Specifically, the first spacer 70*a* may cover sidewalls of the first sacrificial film pattern 50*a* and sidewalls of the first etched mask film pattern 60*a*. In addition, the first spacer 70*a* may include a first portion 70*a*-1 and a second portion 70*a*-2. The first portion 70*a*-1 of the first spacer 70*a* may be defined as the portion of the first spacer 70*a* formed on a side (e.g., sidewall) of the first sacrificial film pattern 50*a*, and the second portion 70*a*-2 of the first spacer 70*a* may be defined as the portion of the first spacer 70*a* formed on the other/opposing side (e.g., sidewall) of the first sacrificial film pattern 50*a*.

The second spacer 70*b* may cover sidewalls of the second sacrificial film pattern 50*b* and sidewalls of the second etched mask film pattern 60*b*. In addition, the second spacer 70*b* may include a third portion 70*b*-1 and a fourth portion 70*b*-2. The third portion 70*b*-1 of the second spacer 70*b* may be defined as the portion of the second spacer 70*b* formed on a side (e.g., sidewall) of the second sacrificial film pattern 50*b*, and the fourth portion 70*b*-2 of the second spacer 70*b* may be defined as the portion of the second spacer 70*b* formed on the other/opposing side (e.g., sidewall) of the second sacrificial film pattern 50*b*.

Figure 6:
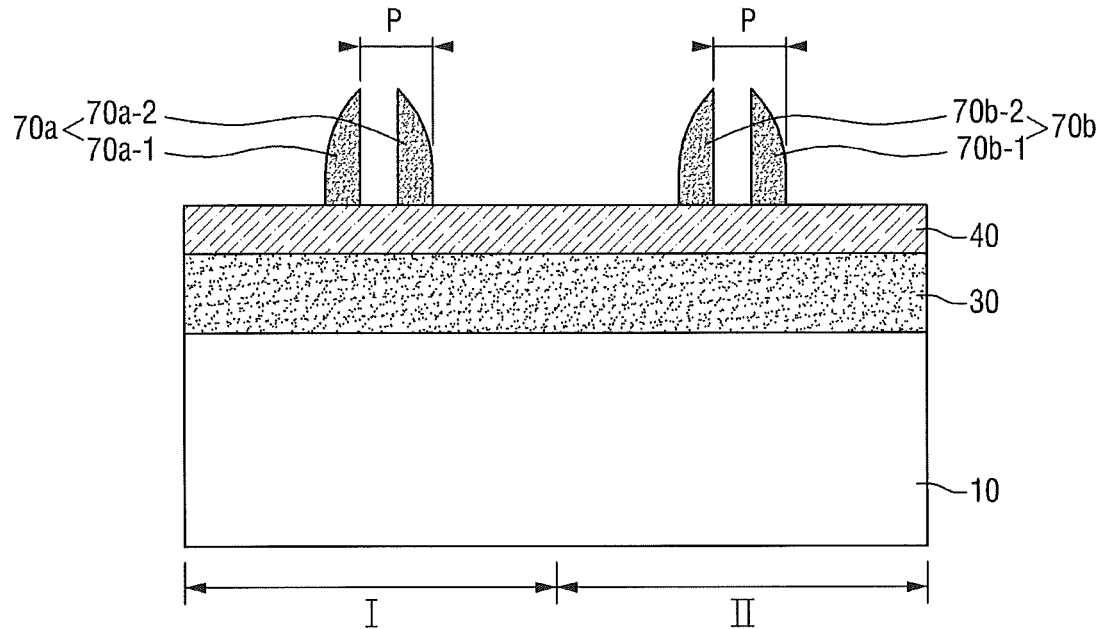

Referring to FIGS. 1 and 6, the first and second sacrificial film patterns 50*a* and 50*b* (e.g., as illustrated in FIG. 5) may be removed (Block 140).

Specifically, the first and second sacrificial film patterns 50*a* and 50*b* may be removed using an aching process or a cleaning process, among others. The first and second etched mask film patterns 60*a* and 60*b* (e.g., as illustrated in FIG. 5) may be removed at the same time as the first and second sacrificial film patterns 50*a* and 50*b*.

As a result of the removal of the first and second sacrificial film patterns 50*a* and 50*b*, the first spacer 70*a* may be located on the first region I of the semiconductor substrate 10, and the second spacer 70*b* may be located on the second region II of the semiconductor substrate 10. As described herein, the term "pitch" refers to a distance between corresponding points (e.g., midpoints, rightmost points, or leftmost points) of adjacent/neighboring portions of a pattern. For example, a pitch P of/between neighboring portions of the first spacer 70*a* may be substantially equal to a pitch P of/between neighboring portions of the second spacer 70*b*. Specifically, the pitch P of/between the first portion 70*a*-1 of the first spacer 70*a* and the second portion 70*a*-2 of the first spacer 70*a* may be substantially equal to the pitch P of/between the third portion 70*b*-1 of the second spacer 70*b* and the fourth portion 70*b*-2 of the second spacer 70*b*. As described herein, the term "substantially equal" refers to two or more values that are the same or have a difference of less than 10%.

Figure 7:
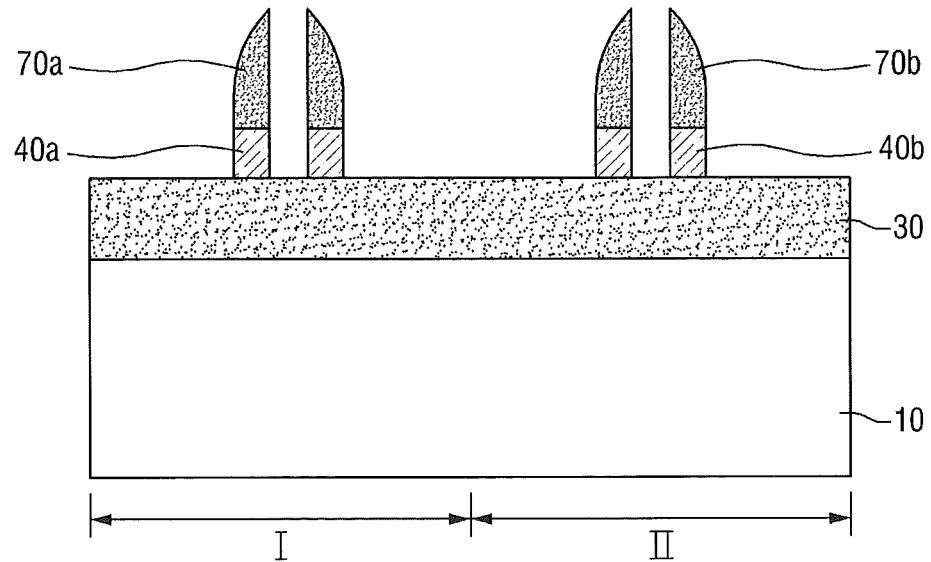

Referring to FIGS. 1 and 7, the buffer film 40 (e.g., as illustrated in FIG. 6) may be etched using the first and second spacers 70*a* and 70*b* as an etch mask, thereby forming first and second buffer film patterns 40*a* and 40*b* (Block 150).

The buffer film 40 may be etched using, for example, a plasma etching process, among other etching processes. Consequently, the first spacer 70*a* may be formed on the first buffer film pattern 40*a*, and the second spacer 70*b* may be formed on the second buffer film pattern 40*b*.

The hard mask film 30 may be patterned to form an etch mask for etching the semiconductor substrate 10. An etch mask made of a polysilicon film may be used to pattern the hard mask film 30. However, an etch selectivity of the polysilicon film may not be greatly different from that of the first and second sacrificial film patterns 50*a* and 50*b* (e.g., FIG. 5), which may be amorphous carbon film patterns. Therefore, it may be difficult to form a spacer by conformally forming the polysilicon film on the first and second sacrificial film patterns 50*a* and 50*b* and then etching-back the polysilicon film.

Accordingly, the first and second spacers 70a and 70b may be formed by conformally forming the spacer film 70 (e.g., as illustrated in FIG. 4), which is an oxide film, on the first and second sacrificial film patterns 50a and 50b and etching back the spacer film 70. Then, in the process illustrated in FIG. 7, the buffer film 40 may be etched using the first and second spacers 70a and 70b as an etch mask, thereby forming the first and second buffer film patterns 40a and 40b. In this way, patterns of the first and second spacers 70a and 70b can be transferred to the buffer film 40.

Referring to FIGS. 1 and 8-10, the second spacer 70b and the second buffer film pattern 40b may be trimmed (Block 160).

Figure 10:
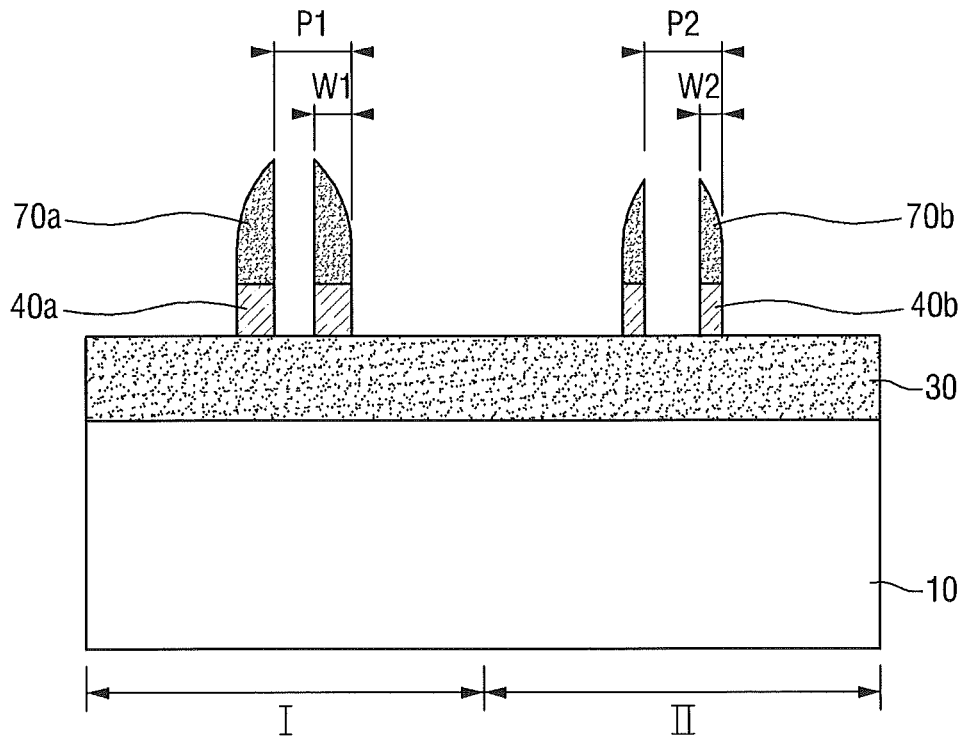

Specifically, the second spacer 70b may be trimmed such that a line width W2 of the second spacer 70b becomes smaller than a line width W1 of the first spacer 70a. Also, the second buffer film pattern 40b may be trimmed such that a line width W2 of the second buffer film pattern 40b becomes smaller than a line width W1 of the first buffer film pattern 40a. Referring to FIG. 10, the line width W1 of the first spacer 70a is equal to the line width W1 of the first buffer film pattern 40a, and the line width W2 of the second spacer 70b is equal to the line width W2 of the second buffer film pattern 40b. However, the present inventive concepts are not limited thereto.

Figure 8:
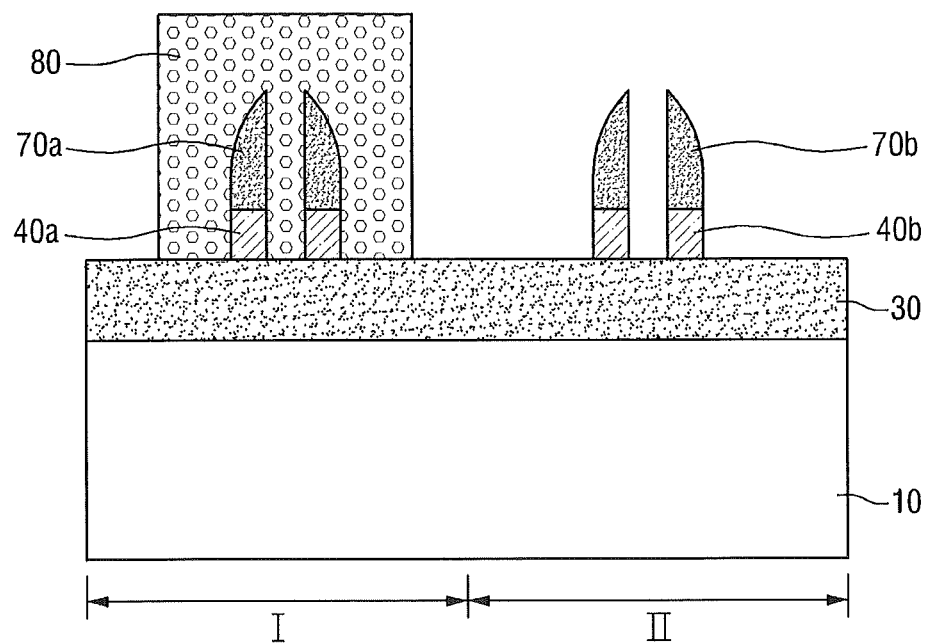

Referring to FIG. 8, a blocking mask 80 may be formed to cover the first spacer 70a and the first buffer film pattern 40a. That is, the blocking mask 80 may be formed on part of the first region I of the semiconductor substrate 10. The blocking mask 80 may be any one of an amorphous carbon block and a photoresist block, among other blocks/masks.

If the blocking mask 80 is an amorphous carbon block and if the first and second spacers 70a and 70b are oxide film spacers, because a refractive index of an amorphous carbon block may be equal to that of an oxide film spacer, the first spacer 70a (i.e., an oxide film spacer) may not be recognized in a block photolithography process in which an amorphous carbon block is formed on the first spacer 70a. Thus, it may be difficult to find an alignment position of the blocking mask 80, which may be formed to cover the first spacer 70a, using only the first spacer 70a. Accordingly, this may result in an alignment failure of the blocking mask 80.

On the other hand, the refractive index of a polysilicon film may be significantly different from that of an amorphous carbon block. Therefore, if a block photolithography process is performed after the first and second buffer film patterns 40a and 40b are formed, the alignment position of the blocking mask 80 can be found using the first buffer film pattern 40a, which may include a polysilicon film. Accordingly, this can reduce alignment failure of the blocking mask 80.

Figure 9:
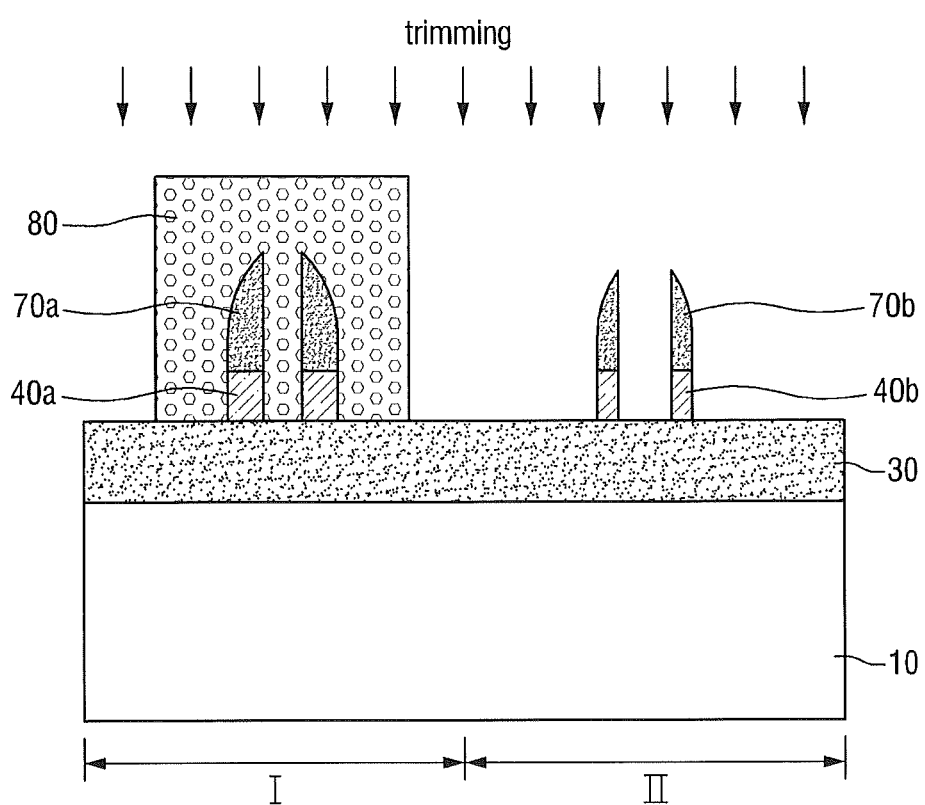

Referring to FIG. 9, the second spacer 70b and the second buffer film pattern 40b may be trimmed.

Specifically, the second spacer 70b and the second buffer film pattern 40b may be etched using any one of a wet etching process and a plasma etching process, among other etching processes. For example, the second spacer 70b (e.g., an oxide film spacer) and the second buffer film pattern 40b (e.g., a polysilicon film pattern) may be etched simultaneously using a plasma etching process. However, the present inventive concept is not limited thereto. The second spacer 70b and the second buffer film pattern 40b can also be etched separately using separate etching processes. For example, the second spacer 70b may be wet-etched using hydrogen fluoride (HF) as a base.

Because the second spacer 70b and the second buffer film pattern 40b are etched (i.e., trimmed), the line width of the second spacer 70b and the line width of the second buffer film pattern 40b may be reduced. Because the first spacer 70a and the first buffer film pattern 40a in FIG. 9 are covered with the blocking mask 80 during the trimming process, they may not be trimmed. Therefore, the line width of the first spacer 70a and the line width of the first buffer film pattern 40a may be unaffected by the trimming process. In other words, the line width of the first spacer 70a and the line width of the first buffer film pattern 40a may remain unchanged from a time before the trimming process to a time after the trimming process.

Referring to FIG. 10, the blocking mask 80 of FIGS. 8/9 may be removed. For example, the blocking mask 80 may be removed using an ashing process or a strip process, among others.

As a result of the trimming process of FIG. 9, the line width W2 of the second spacer 70b may become smaller than the line width W1 of the first spacer 70a. In addition, the line width W2 of the second buffer film pattern 40b may become smaller than the line width W1 of the first buffer film pattern 40a. Before the trimming process, the line width of the first spacer 70a may be equal to the line width of the second spacer 70b. However, after the trimming process, the line width W1 of the first spacer 70a may become different from the line width W2 of the second spacer 70b. In addition, after the trimming process, the line width W1 of the first buffer film pattern 40a may become different from the line width W2 of the second buffer film pattern 40b.

Even after the trimming process, a pitch P1 of/between the neighboring portions of the first spacer 70a may be substantially equal to a pitch P2 of/between the neighboring portions of the second spacer 70b. That is, a pitch of/between a plurality of spacers (e.g., spacer portions) located on the first region I of the semiconductor substrate 10 may be substantially equal to a pitch of/between a plurality of spacers (e.g., spacer portions) located on the second region II of the semiconductor substrate 10. Also, even after the trimming process, a pitch P1 of/between neighboring portions of the first buffer film pattern 40a may be substantially equal to a pitch P2 of/between neighboring portions of the second buffer film pattern 40b.

Figure 11:
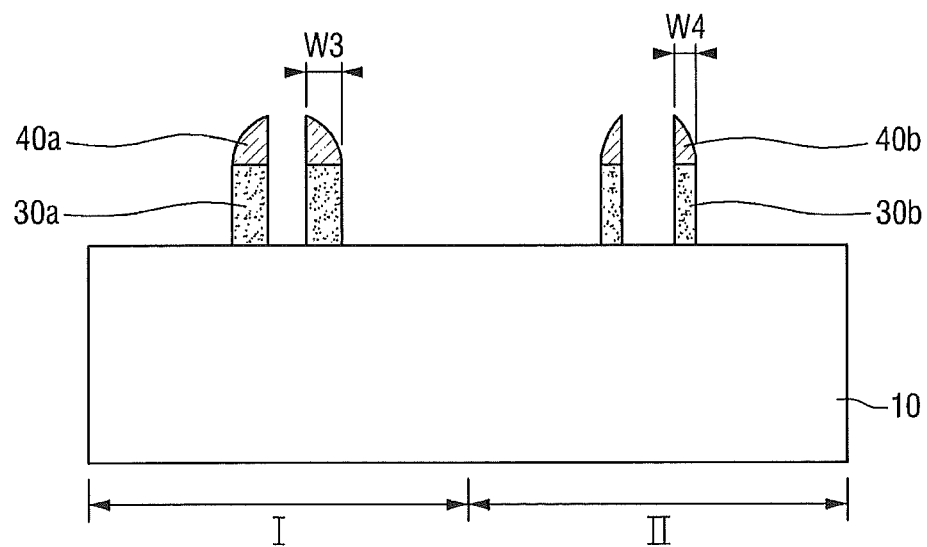

Referring to FIGS. 1 and 11, first and second hard mask film patterns 30a and 30b may be formed by etching the hard mark film 30 of FIG. 10 using the first buffer film pattern 40a and the trimmed second buffer film pattern 40b as an etch mask (Block 170).

The hard mask film 30 may be etched using, for example, a plasma etching process, among other etching processes. Specifically, the first hard mask film pattern 30a may be formed by etching the hard mask film 30 located on the first region I of the semiconductor substrate 10 using the first spacer 70a of FIG. 10 and the first buffer film pattern 40a as an etch mask. Also, the second hard mask film pattern 30b may be formed by etching the hard mask film 30 located on the second region II of the semiconductor substrate 10 using the trimmed second spacer 70b of FIG. 10 and the trimmed second buffer film pattern 40b as an etch mask.

In the process of etching the hard mask film 30, the first spacer 70a and the trimmed second spacer 70b may be removed, and part of the first buffer film pattern 40a and part of the trimmed second buffer film pattern 40b may be removed.

The first hard mask film pattern 30a may be formed on the first region I of the semiconductor substrate 10, and the second hard mask film pattern 30b may be formed on the second region II of the semiconductor substrate 10. A line width W3 of the first hard mask film pattern 30a may be greater than a line width W4 of the second hard mask film pattern 30b. In other words, by using the operations of forming patterns of a semiconductor device according to various embodiments of the present inventive concepts, the first and second hard mask film patterns 30a and 30b can be formed having different line widths.

Referring to FIGS. 1 and 12, first and second semiconductor patterns 10a and 10b may be formed by etching the semiconductor substrate 10 using the first and second hard mask film patterns 30a and 30b of FIG. 11 as an etch mask.

Because the first and second hard mask film patterns 30a and 30b used as an etch mask have different line widths (i.e., the line widths W3 and W4, respectively), the first and second semiconductor patterns 10a and 10b may also have different line widths. For example, a line width W5 of the first semiconductor pattern 10a may be greater than a line width W6 of the second semiconductor pattern 10b. In other words, a line width of a pattern formed in the first region I of the semiconductor substrate 10 may be different from a line width of a pattern formed in the second region II of the semiconductor substrate 10.

A pitch P5 of/between neighboring portions of the first semiconductor pattern 10a may be substantially equal to a pitch P6 of/between neighboring portions of the second semiconductor pattern 10b. In other words, although the first semiconductor pattern 10a in the first region I and the second semiconductor pattern 10b in the second region II have different line widths, they may have substantially the same pitch.

Because the operations (e.g., as illustrated in FIG. 1) of forming patterns of a semiconductor device according to various embodiments of the present inventive concepts may employ a double-patterning technology using the first and second spacers 70a and 70b, patterns with a tolerance of 1 nanometer (nm) or less can be formed. Therefore, the operations of forming patterns of a semiconductor device according to various embodiments of the present inventive concepts can control/reduce the dispersion of pattern widths.

Moreover, the operations (e.g., as illustrated in FIG. 1) of forming patterns of a semiconductor device according to various embodiments of the present inventive concepts may include the process of trimming the second spacer 70b and the second buffer film pattern 40b. Thus, the first spacer 70a and the trimmed second spacer 70b may have different line widths. Consequently, in the operations of forming patterns of a semiconductor device according to various embodiments of the present inventive concepts, the first and second semiconductor patterns 10a and 10b having different line widths can be formed using the first and second spacers 70a and 70b having different line widths. Because patterns having different line widths can be formed by one (i.e., a single) process, the design freedom of a semiconductor device can be increased by the operations of forming patterns of a semiconductor device according to various embodiments of the present inventive concepts.

Figure 13:
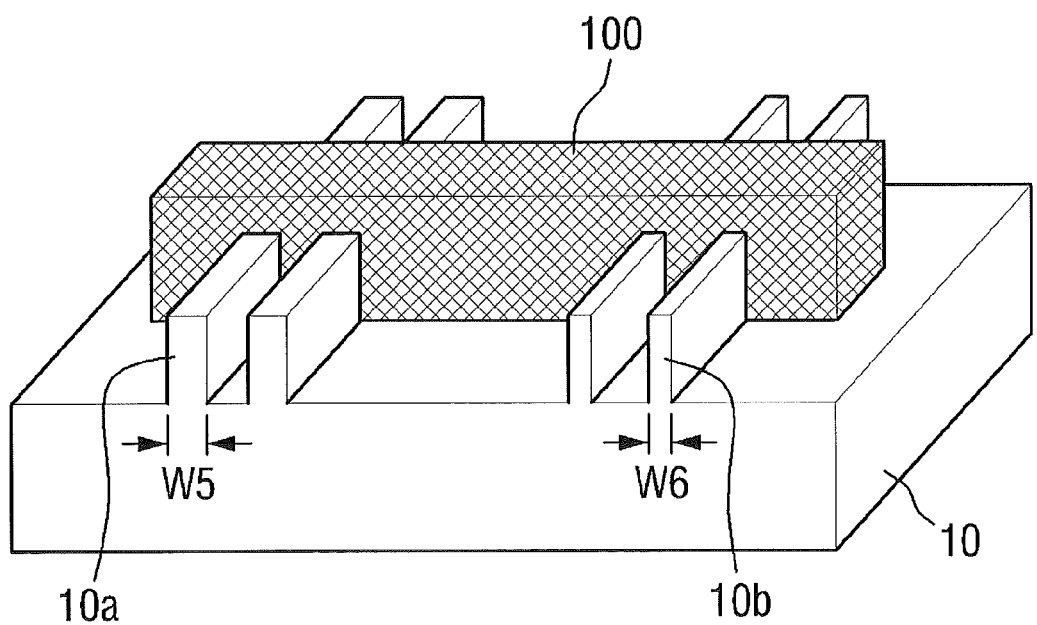
FIG. 13 is a perspective view of a semiconductor device formed using operations of forming patterns of a semiconductor device according to various embodiments of the present inventive concepts.

FIG. 13 is a perspective view of a semiconductor device using operations of forming patterns of a semiconductor device according to various embodiments of the present inventive concepts. Referring to FIG. 13, a portion of a first semiconductor pattern 10a and a portion of a second semiconductor pattern 10b may respectively be used as a first channel region and a second channel region of a fin-type field effect transistor (FinFET). A gate 100 may cross the first and second semiconductor patterns 10a and 10b. In other words, the operations of forming patterns of a semiconductor device according to various embodiments of the present inventive concepts can be used to fabricate a FinFET having channel regions with different line widths.

A line width W5 of the first semiconductor pattern 10a is different from a line width W6 of the second semiconductor pattern 10b. Thus, a line width of the first channel region of the FinFET shown in FIG. 13 may be different from a line width of the second channel region of the FinFET. Specifically, the line width of the first channel region may be greater than the line width of the second channel region. Because a threshold voltage Vth of a FinFET is related to a line width of a channel region of the FinFET, the FinFET shown in FIG. 13 can have various/different threshold voltages Vth (e.g., corresponding to the respective different line widths). Therefore, if the operations of forming patterns of a semiconductor device according to the present inventive concepts are used, a FinFET having various/different threshold voltages Vth can be fabricated by one (e.g., a single) process.

Figure 14:
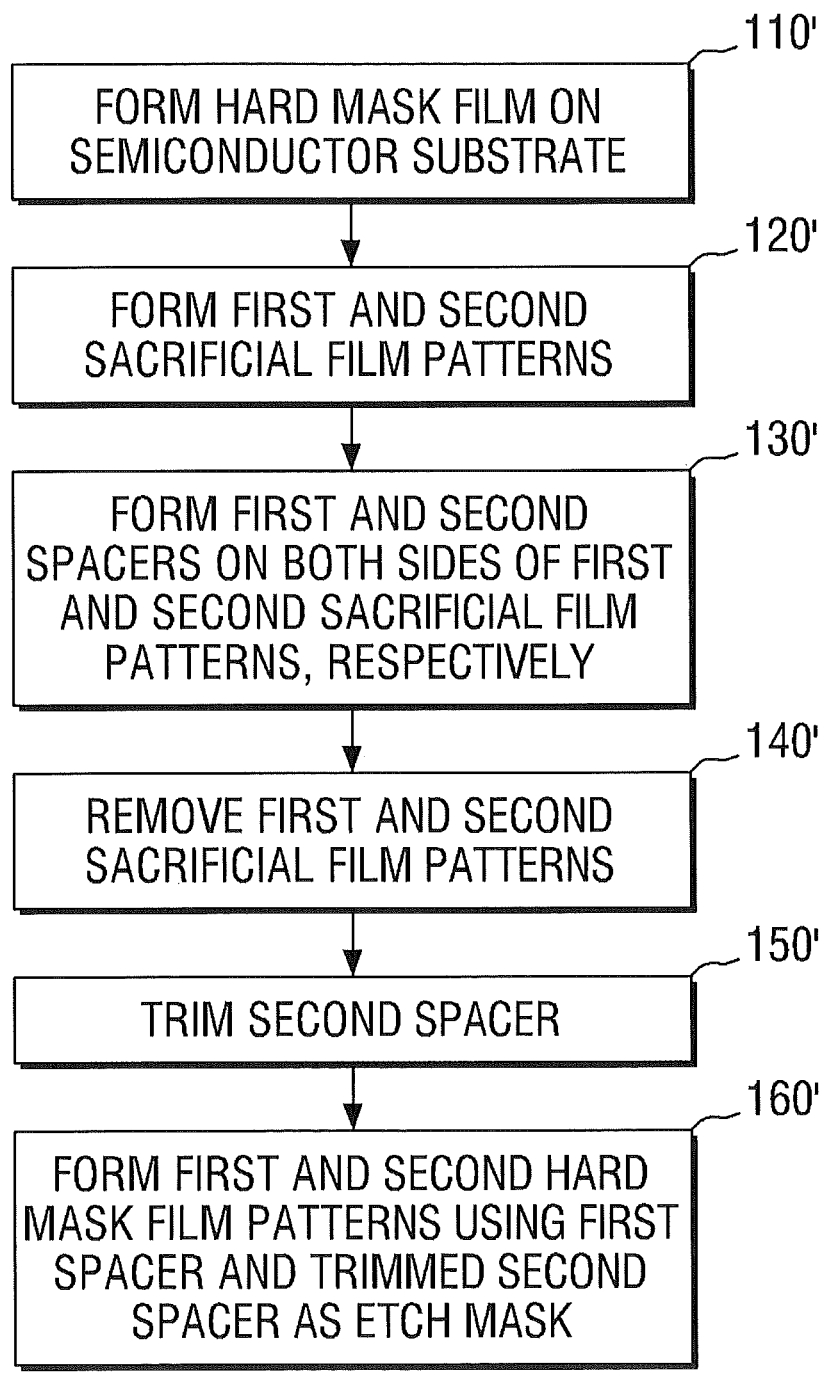
FIG. 14 is a flowchart illustrating operations of forming patterns of a semiconductor device according to various embodiments of the present inventive concepts.
Figure 15:
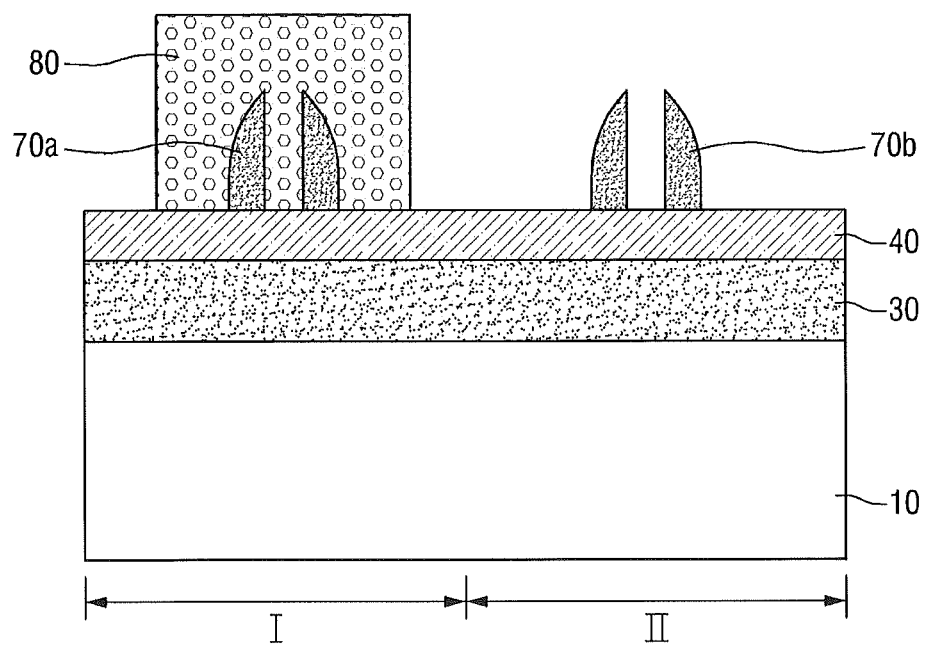
FIGS. 15 through 17 are cross-sectional views illustrating the operations of forming patterns of a semiconductor device of FIG. 14 according to various embodiments of the present inventive concepts.
Figure 16:
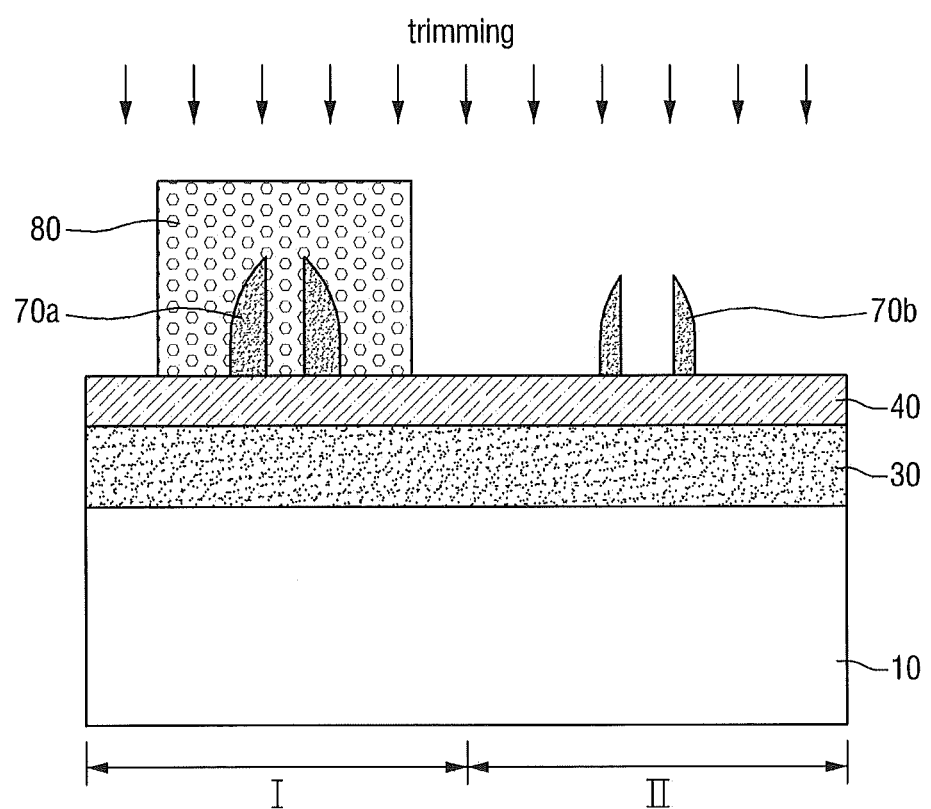
Figure 17:
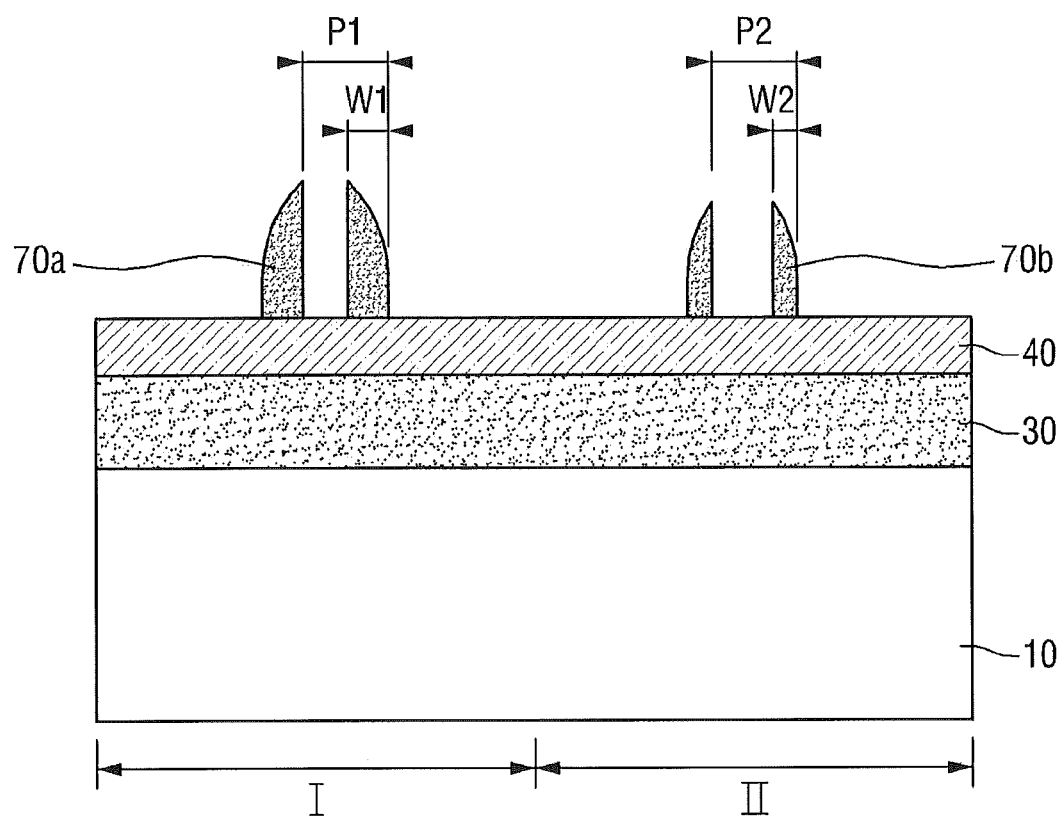

Operations of forming patterns of a semiconductor device according to various embodiments of the present inventive concepts will now be described with reference to FIGS. 14 through 17. For simplicity, descriptions of similarities with the operations illustrated in FIG. 1 may be omitted. FIG. 14 is a flowchart illustrating operations of forming patterns of a semiconductor device according to various embodiments of the present inventive concepts. FIGS. 15 through 17 are cross-sectional views illustrating the operations of FIG. 14 of forming patterns of a semiconductor device according to various embodiments of the present inventive concepts.

In the operations of FIG. 14 of forming patterns of a semiconductor device according to various embodiments of the present inventive concepts, after a second spacer 70b is trimmed, a buffer film 40 may be etched using a first spacer 70a and the trimmed second spacer 70b as an etch mask. As a result, first and second buffer film patterns 40a and 40b are formed. In other words, in the operations of forming patterns of a semiconductor device according to various embodiments of the present inventive concepts, the second buffer film pattern 40b is not trimmed with the second spacer 70b.

Referring to FIGS. 2 and 14, a hard mask film 30 may be formed on a semiconductor substrate 10 (Block 110').

Specifically, the hard mask film 30, the buffer film 40, and a sacrificial film 50 may be formed sequentially on the semiconductor substrate 10, and first and second etched mask film patterns 60a and 60b may be formed on the sacrificial film 50 to be separated from each other.

Referring to FIGS. 3 and 14, first and second sacrificial film patterns 50a and 50b may be formed to be separated from each other (Block 120').

Specifically, the sacrificial film 50 (e.g., as illustrated in FIG. 2) may be etched using the first and second etched mask film patterns 60a and 60b as an etch mask. As a result, the first sacrificial film pattern 50a may be formed on a first region I of the semiconductor substrate 10, and the second sacrificial film pattern 50b may be formed on a second region II of the semiconductor substrate 10.

Referring to FIGS. 4, 5, and 14, the first spacer 70a may be formed on both/opposing sides of the first sacrificial film pattern 50a, and the second spacer 70b may be formed on both/opposing sides of the second sacrificial film pattern 50b (Block 130').

Referring to FIGS. 6 and 14, the first and second sacrificial film patterns 50a and 50b (e.g., as illustrated in FIG. 5) may be removed (Block 140').

Referring to FIGS. 14 through 17, the second spacer 70b may be trimmed (Block 150'). Specifically, the second spacer 70b may be trimmed such that a line width W2 of the second spacer 70b becomes smaller than a line width W1 of the first spacer 70a.

Referring to FIG. 15, a blocking mask 80 may be formed to cover the first spacer 70a. In other words, the blocking mask 80 may be formed on part of the first region I of the semiconductor substrate 10. The blocking mask 80 may be, for example, any one of an amorphous carbon block and a photoresist block, among other blocks/masks.

Referring to FIG. 16, the second spacer 70b may be trimmed. Specifically, the second spacer 70b may be etched using any one of a wet etching process and a plasma etching process, among other etching processes. For example, the second spacer 70b may be wet-etched using HF as a base. However, the present inventive concepts are not limited thereto.

Because the second spacer 70b is etched (i.e., trimmed), the line width of the second spacer 70b may be reduced. Because the first spacer 70a is covered with the blocking mask 80 during the trimming process, however, it is not trimmed. Therefore, the line width of the first spacer 70a may be unaffected by the trimming process. In other words, the line width of the first spacer 70a may remain unchanged by the trimming process.

Referring to FIG. 17, the blocking mask 80 (e.g., as illustrated in FIG. 16) may be removed. For example, the blocking mask 80 may be removed using an ashing process or a strip process, among others.

As a result of the trimming process, the line width W2 of the second spacer 70b may become smaller than the line width W1 of the first spacer 70a. Before the trimming process, the line width of the first spacer 70a may be equal to the line width of the second spacer 70b. However, after the trimming process, the line width of the first spacer 70a may become different from the line width of the second spacer 70b.

Even after the trimming process, a pitch P1 of/between neighboring portions of the first spacer 70a may be substantially equal to a pitch P2 of/between neighboring portions of the second spacer 70b. That is, a pitch of/between a plurality of spacers (e.g., spacer portions) located on the first region I of the semiconductor substrate 10 may be substantially equal to a pitch of/between a plurality of spacers (e.g., spacer portions) located on the second region II of the semiconductor substrate 10.

Referring to FIGS. 10 and 17, the first and second buffer film patterns 40a and 40b may be formed by etching the buffer film 40 of FIG. 17 using the first and second spacers 70a and 70b as an etch mask.

In the operations of FIG. 14 of forming masks of a semiconductor device according to various embodiments of the present inventive concepts, the second buffer film pattern 40 is not trimmed with the second spacer 70b. Rather, referring to FIGS. 11 and 14, after trimming the second spacer 70b, first and second hard mask film patterns 30a and 30b may be formed by etching the hard mask film 30 (e.g., as illustrated in FIG. 10) using the first spacer 70a and the trimmed second spacer 70b as an etch mask (Block 160'). Referring to FIG. 10, the first buffer film pattern 40a may located between the first spacer 70a and the hard mask film 30, and the second buffer film pattern 40b may be located between the trimmed second spacer 70b and the hard mask film 30. Therefore, the first and second buffer film patterns 40a and 40b may also be used as an etch mask in the process of etching the hard mask film 30.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming patterns of a semiconductor device, the method comprising:
    forming a hard mask film on a semiconductor substrate;
    forming first and second sacrificial film patterns that are spaced apart from each other on the hard mask film;
    forming a first spacer on opposing sidewalls of the first sacrificial film pattern and a second spacer on opposing sidewalls of the second sacrificial film pattern;
    removing the first and second sacrificial film patterns;
    trimming the second spacer such that a line width of the second spacer becomes smaller than a line width of the first spacer;
    forming a buffer film on the hard mask film after forming the hard mask film and before forming the first and second sacrificial film patterns;
    forming first and second buffer film patterns by etching the buffer film using the first and second spacers as an etch mask after removing the first and second sacrificial film patterns and before trimming the second spacer,
    wherein trimming the second spacer comprises trimming the second spacer and the second buffer film pattern such that a line width of the second buffer film pattern becomes smaller than a line width of the first buffer film pattern; and
    forming first and second hard mask film patterns by etching the hard mask film using the first spacer and the trimmed second spacer as an etch mask.

2. The method of claim 1, wherein:
    the hard mask film comprises a nitride film and/or an oxide film;
    the first and second sacrificial film patterns comprise carbon film patterns; and
    the first and second spacers comprise oxide film spacers.

3. The method of claim 1, further comprising:
    forming first and second semiconductor patterns having different line widths by etching the semiconductor substrate using the first and second hard mask film patterns as an etch mask,
    wherein:
        the semiconductor device comprises a fin-type field effect transistor (FinFET); and
        a portion of the first semiconductor pattern and a portion of the second semiconductor pattern comprise a first channel region and a second channel region, respectively.

4. The method of claim 3, wherein a line width of the first channel region is greater than a line width of the second channel region.

5. The method of claim 3, wherein a pitch of neighboring portions of the first semiconductor pattern is substantially equal to a pitch of neighboring portions of the second semiconductor pattern.

6. The method of claim 1, wherein forming the first and second sacrificial film patterns comprises:
    forming a sacrificial film comprising a carbon film on the hard mask film;
    forming first and second oxynitride film patterns that are spaced apart from each other on the sacrificial film; and
    etching the sacrificial film using the first and second oxynitride film patterns as an etch mask.

7. The method of claim 1,
wherein:
forming the first and second sacrificial film patterns comprises forming the first and second sacrificial film patterns on the buffer film; and
forming the first and second hard mask film patterns comprises forming the first hard mask film pattern by etching the hard mask film using the first spacer and the first buffer film pattern as an etch mask and forming the second hard mask film pattern by etching the hard mask film using the trimmed second spacer and the trimmed second buffer film pattern as an etch mask.

8. The method of claim 7, wherein trimming the second spacer and the second buffer film comprises:
forming a blocking mask on the first spacer and the first buffer film pattern;
etching the second spacer such that the line width of the second spacer becomes smaller than the line width of the first spacer; and
etching the second buffer film pattern such that the line width of the second buffer film pattern becomes smaller than the line width of the first buffer film pattern.

9. The method of claim 7, wherein:
the hard mask film comprises a nitride film or an oxide film;
the first and second sacrificial film patterns comprise carbon film patterns;
the first and second spacers comprise oxide film spacers;
the buffer film comprises a polysilicon film; and
trimming the second spacer and the second buffer film pattern comprises etching the second spacer and the second buffer film pattern using wet etching or plasma etching.

10. The method of claim 1, wherein:
the opposing sidewalls of the first and second sacrificial film patterns comprise first and second sidewalls and third and fourth sidewalls, respectively;
the first spacer comprises a first portion formed on the first sidewall of the first sacrificial film pattern and a second portion formed on the second sidewall of the first sacrificial film pattern;
the second spacer comprises a third portion formed on the third sidewall of the second sacrificial film pattern and a fourth portion formed on the fourth sidewall of the second sacrificial film pattern; and
trimming the second spacer comprises trimming the third and fourth portions such that respective line widths of the third and fourth portions become smaller than a line width of the first portion or the second portion, and a pitch of the first portion and the second portion is substantially equal to a pitch of the trimmed third portion and the trimmed fourth portion.

11. A method of forming patterns of a semiconductor device, the method comprising:
forming a nitride film and a polysilicon film sequentially on a semiconductor substrate;
forming first and second carbon film patterns that are spaced apart from each other on the polysilicon film;
forming a first oxide film spacer on opposing sidewalls of the first carbon film pattern and a second oxide film spacer on opposing sidewalls of the second carbon film pattern;
removing the first and second carbon film patterns;
forming first and second polysilicon film patterns by etching the polysilicon film using the first and second oxide film spacers as an etch mask;
trimming the second oxide film spacer and the second polysilicon film pattern such that a line width of the second oxide film spacer becomes smaller than a line width of the first oxide film spacer and that a line width of the second polysilicon film pattern becomes smaller than a line width of the first polysilicon film pattern; and
forming first and second nitride film patterns by etching the nitride film using the first polysilicon film pattern and the trimmed second polysilicon film pattern as an etch mask.

12. The method of claim 11, wherein trimming the second oxide film spacer and the second polysilicon film pattern comprises forming amorphous carbon or photoresist on the first oxide film spacer and the first polysilicon film pattern and wet-etching the second oxide film spacer and the second polysilicon film pattern using hydrogen fluoride (HF) as a base.

13. The method of claim 11, further comprising:
forming first and second semiconductor patterns having different line widths by etching the semiconductor substrate using the first and second nitride film patterns as an etch mask,
wherein:
the semiconductor device comprises a FinFET; and
a portion of the first semiconductor pattern and a portion of the second semiconductor pattern comprise a first channel region and a second channel region, respectively.

14. The method of claim 13, wherein a pitch of neighboring portions of the first semiconductor pattern is substantially equal to a pitch of neighboring portions of the second semiconductor pattern.

15. The method of claim 11, wherein forming the first and second carbon film patterns comprises:
forming a carbon film on the nitride film;
forming first and second oxynitride film patterns that are spaced apart from each other on the carbon film; and
etching the carbon film using the first and second oxynitride film patterns as an etch mask.

16. A method of forming patterns of a fin-type field effect transistor (FinFET) semiconductor device, the method comprising:
forming a hard mask film on a semiconductor substrate;
forming first and second sacrificial film patterns that are spaced apart from each other on the hard mask film;
forming a first spacer on opposing sidewalls of the first sacrificial film pattern and a second spacer on opposing sidewalls of the second sacrificial film pattern;
removing the first and second sacrificial film patterns;
trimming the second spacer such that a line width of the second spacer becomes smaller than a line width of the first spacer;
forming first and second hard mask film patterns by etching the hard mask film using the first spacer and the trimmed second spacer as an etch mask; and
forming first and second semiconductor patterns having different line widths by etching the semiconductor substrate using the first and second hard mask film patterns as an etch mask.

17. The method of claim 16, wherein:
a portion of the first semiconductor pattern and a portion of the second semiconductor pattern comprise a first channel region and a second channel region, respectively;
a line width of the first channel region is greater than a line width of the second channel region; and a pitch of neighboring portions of the first semiconductor pattern is substantially equal to a pitch of neighboring portions of the second semiconductor pattern.

18. The method of claim 16, further comprising:

forming a buffer film on the hard mask film before forming the first and second sacrificial film patterns; and forming first and second buffer film patterns by etching the buffer film using the first and second spacers as an etch mask after removing the first and second sacrificial film patterns and before trimming the second spacer, wherein:

trimming the second spacer comprises trimming the second spacer and the second buffer film pattern; and forming the first and second hard mask film patterns comprises forming the first hard mask film pattern by etching the hard mask film using the first spacer and the first buffer film pattern as an etch mask and forming the second hard mask film pattern by etching the hard mask film using the trimmed second spacer and the trimmed second buffer film pattern as an etch mask, such that the first spacer and the trimmed second spacer are removed and portions of the first buffer film pattern and the trimmed second buffer film pattern are etched.

19. The method of claim 18, wherein trimming the second spacer and the second buffer film comprises:

forming a blocking mask on sidewalls of the first spacer and sidewalls of the first buffer film pattern;

etching the second spacer such that the line width of the second spacer becomes smaller than the line width of the first spacer; and etching the second buffer film pattern such that a line width of the second buffer film pattern becomes smaller than a line width of the first buffer film pattern.

20. The method of claim 16, further comprising:

forming a buffer film on the hard mask film after forming the hard mask film and before forming the first and second sacrificial film patterns; and forming first and second buffer film patterns by etching the buffer film using the first and second spacers as an etch mask after removing the first and second sacrificial film patterns and after trimming the second spacer.

* * * * *